United States Patent [19]
Kang et al.

[11] Patent Number: 5,566,036
[45] Date of Patent: Oct. 15, 1996

[54] CABLE CONNECTING APPARATUS BETWEEN AUDIO CONTROL HEAD AND MAIN PRINTED CIRCUIT BOARD FOR VIDEO CASSETTE TAPE RECORDER

[75] Inventors: Sung S. Kang; Sung H. Choi, both of Kyungki-do; Myung C. Baek, Seoul; Sung P. Hong, Kyungki-do; Ji Y. Lee; Lee H. You, both of Seoul; Soo B. Lee, Kyungki-do; Hee Y. Park, Kyungki-do; Il M. Park, Kyungki-do, all of Rep. of Korea

[73] Assignee: LG Electronics Inc., Seoul, Rep. of Korea

[21] Appl. No.: 420,560

[22] Filed: Apr. 12, 1995

[30] Foreign Application Priority Data

Apr. 13, 1994 [KR] Rep. of Korea ............ 7690/1994
Apr. 13, 1994 [KR] Rep. of Korea ............ 7691/1994

[51] Int. Cl.$^6$ .................................................. G11B 15/00
[52] U.S. Cl. ........................................................... 360/88
[58] Field of Search ................................. 360/84–85, 128, 360/88

[56] References Cited

U.S. PATENT DOCUMENTS 5,317,466  5/1994  Hasagawa .................. 360/130.24
5,363,263  11/1994  Ohji ............................... 360/108

Primary Examiner—John H. Wolff
Attorney, Agent, or Firm—Birch, Stewart, Kolasch & Birch, LLP

[57] ABSTRACT

An improved cable connecting apparatus between an audio control head and a main printed circuit board for a VCR capable of making it easy to connect between a loading motor and audio control head and a main printed circuit board, so that a more correct connection therebetween is obtained, according to an aspect of the present invention, which includes a main printed circuit board; a base plate; a printed circuit board attached to a loading motor mounted on the deck for driving a tape; an audio/control head mounted on the base plate for detecting/recording a predetermined signal; a signal transmitting member for connecting between the audio/control head and the printed circuit board; and a signal connecting member mounted in the printed circuit board for transmitting signals of the audio/control head and the loading motor to the main printed circuit board. According to another aspect of the present invention, there is provided a cable connecting apparatus between an audio/control head and a main printed circuit board for a VCR, which includes a base plate having a hole; a main printed circuit board disposed between the base plate, on which an elongated copper surface is formed; and an audio/control head mounted on the upper surface of the base plate and attached to the printed circuit board, wherein one end of the printed circuit board is extended toward the main printed circuit board through the hole of the base plate along with the signal transferring member.

8 Claims, 5 Drawing Sheets

CABLE CONNECTING APPARATUS BETWEEN AUDIO CONTROL HEAD AND MAIN PRINTED CIRCUIT BOARD FOR VIDEO CASSETTE TAPE RECORDER

BACKGROUND OF THE INVENTION

1. Field of the Invention

The present invention relates to a cable connecting apparatus between an A/C (Audio Control) head and a main PCB (Printed Circuit Board) for a VCR (Video Cassette Tape Recorder), and particularly to an improved cable connecting apparatus between an A/C head and a main PCB for a VCR capable of making it easy to connect cables between a loading motor and A/C head and a main PCB, so that a more correct connection therebetween is obtained.

2. Description of the Conventional Art

Referring to FIG. 1, there is shown a conventional cable connecting apparatus for a VCR. In addition, FIGS. 2 and 3 show the other conventional cable connecting apparatus for a VCR.

Conventionally, in a VCR, an A/C head mounted on the peripheral portion of a rotation head drum is provided for recording an audio signal or control signal outputted from related elements thereof. In addition, there is also provided a tape loading apparatus for guiding the travel of a tape by a driving force of a loading motor.

As shown in FIG. 1, on the upper surface of a base plate 11, a loading motor 12 and an A/C 13 are each mounted. In addition, a main PCB 17 is attached to one side wall of the base plate 11.

On the main PCB 17, a pair of spaced-apart connectors 16 and 19 axe disposed.

In addition, a board 12a is attached to the left-hand side of the loading motor 12 so as to process a signal of the loading motor 12. A pair of terminals 12b are formed on one side wall of the board 12a. One end of each of two first cables 14 is connected to the corresponding terminals 12b, and the other end of each first cable 14 is connected to a connector 15, which is in turn connected to a connector 16 attached to the main PCB 17.

In addition, one side of the A/C head 13 is connected to a second cable 18 connected to the connector 19 attached to the main PCB 17.

Reference numeral 20 denotes a gear arrangement, 21 denotes a pinch roller assembly, and 22 denotes a capstan motor shaft, and all of them are driven by a loading motor 12 to drive a tape.

Meanwhile, as shown in FIGS. 2 and 3, a support plate 31 is disposed on the upper surface of the base plate 30. Here, a head base 32 is engaged to the support plate, so that the height of the head base is adjustable by means of a head base height adjusting screw 37 and a spring 38.

In addition, as shown in FIG. 3, an adjusting hole 102 is formed on one side wall of the base plate 30. A guide hole 101 is formed on one side wall of the support plate 31.

Meanwhile, a first screw 103 and a second screw 104 which are spaced apart from each other are downwardly extended through the support plate 31.

At this time, an elongated hole 105 having a predetermined width is formed where the second screw 104 is inserted, and the support plate 31 is supported on the base plate 30 by the first screw 103 and the second screw 104.

In addition, an A/C head position adjusting screw 37a is disposed to come contact with the upper portion of the support plate 31 through a predetermined portion of the head base 32, so that the travel angle of a tape being in contact with the A/C head 33 is adjusted by a controllable slant of the A/C head 33 by tightening or releasing the A/C head position adjusting screw 37a.

In addition, the A/C head 33 is fixed to the upper surface of the head base 32, and the PCB 34 for processing a signal of the A/C head 33 is attached to the side wall of the A/C head 33. A connector 35 is attached to the upper portion of the PCB 34.

Meanwhile, one end of the cable 36 is connected to the connector 35, and the other side thereof is connected to the main PCB 17, so that the signals of the A/C head 33 are transmittable therebetween.

The operation of a conventional cable connecting apparatus between an A/C head and a main PCB 17 for a VCR will now be provided.

To begin with, after adjusting the height and angle so that a tape comes into contact with the A/C head 33 using the head base height adjusting screw 37 and the A/C position adjusting screw 37a, if moving the position of the support plate 31 by pushing using an elongated and hard stick after inserting it into the guide hole 101, the second screw 104 is guided within the elongated hole 105.

Thereafter, in the above manner, when the support plate 31 is set, the support plate 31 is fixed to the base plate 30 by tightening the first screw 103 and the second screw 104.

The movement of the position of the support plate 31 is directed to correctly adjust the distance between the head drum detecting a video signal and the A/C head detecting a control signal.

However, since the cable connections between the loading motor 12 and the A/C head 13 are each separately connected to the main PCB 17, the cable connecting work has to be conducted separately for each cable connection, so that the construction thereof is complex, and it is costly to manufacture. In addition, when checking a base plate section in a state that both the connectors 16 and 19 are each not connected to the main PCB 17, the cable connecting of the A/C head and the loading motor should be connected in a manner of zigzag, so that the checking procedure is more complicated and lengthy.

In addition, as shown in FIGS. 2 and 3, the other end of the cable 36 connected to the main PCB 17 is connected to the connector 35 disposed at the side wall of the A/C head 33, so an additional connector and connecting cables are required, and thus it is costly and inconvenient to handle.

SUMMARY OF THE INVENTION

Accordingly, it is an object of the present invention to provide a cable connecting apparatus between an A/C head and a main PCB for a VCR, which overcomes the problems encountered in the conventional cable connecting apparatus therebetween.

It is another object of the present invention to provide an improved cable connecting apparatus between an A/C head and a main PCB for a VCR capable of making it easy to connect between a loading motor and A/C head and a main PCB, so that a more correct connection therebetween is obtained.

To achieve the above objects, there is provided a cable connecting apparatus between an A/C head and a main PCB for a VCR according to an aspect of the present invention, which includes a main printed circuit board; a base plate; a printed circuit board attached to a loading motor mounted on the deck for driving a tape; an audio/control head mounted on the base plate for detecting, drecording a predetermined signal; a signal transmitting member for connecting between the audio/control head and the printed circuit board; and a signal connecting member mounted in the printed circuit board for transmitting signals of the audio/control head and the loading motor to the main printed circuit board.

According to another aspect of the present invention, there is provided a cable connecting apparatus between an A/C head and a main PCB for a VCR, which includes a base plate having a hole; a main printed circuit board disposed below the base plate, on which an elongated copper surface is formed; and an audio/control head mounted on the upper surface of the base plate and attached to the printed circuit board, wherein one end of the printed circuit board is extended toward the main printed circuit board through the hole of the base plate along with the signal transferring member.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
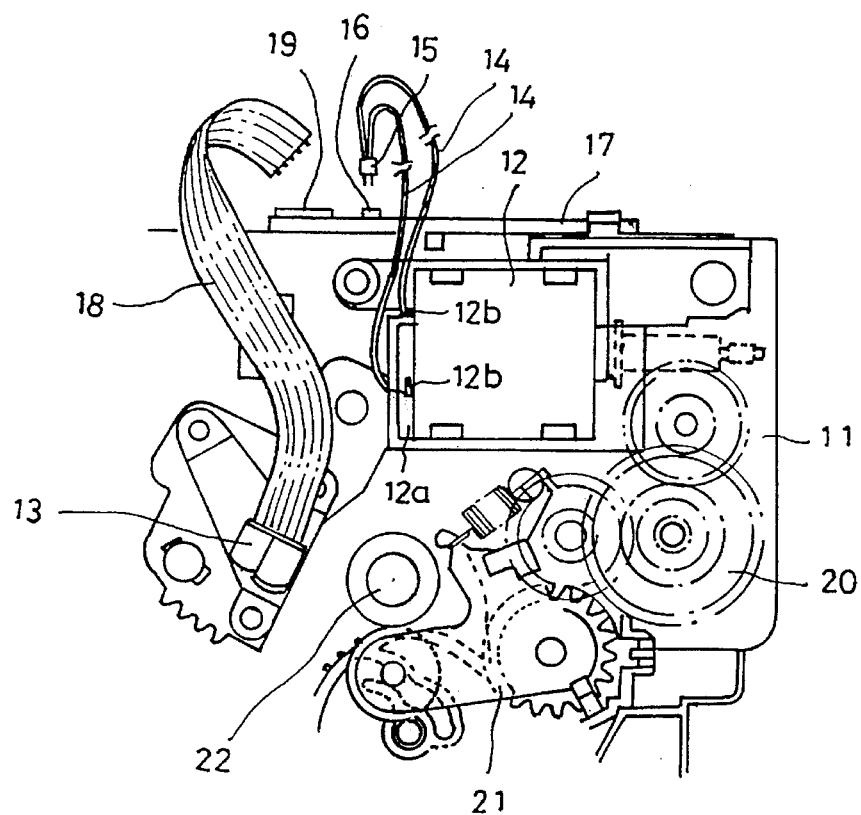
FIG. 1 is a top view showing a conventional cable connecting apparatus of a VCR.
Figure 2:
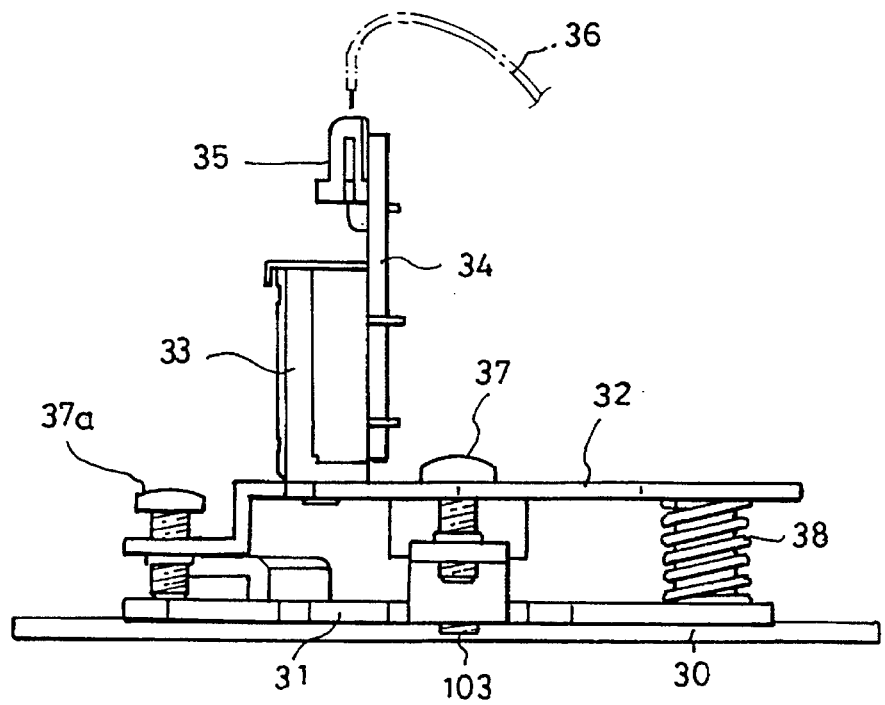
FIG. 2 is a front view showing another conventional cable connecting apparatus of a VCR.
Figure 3:
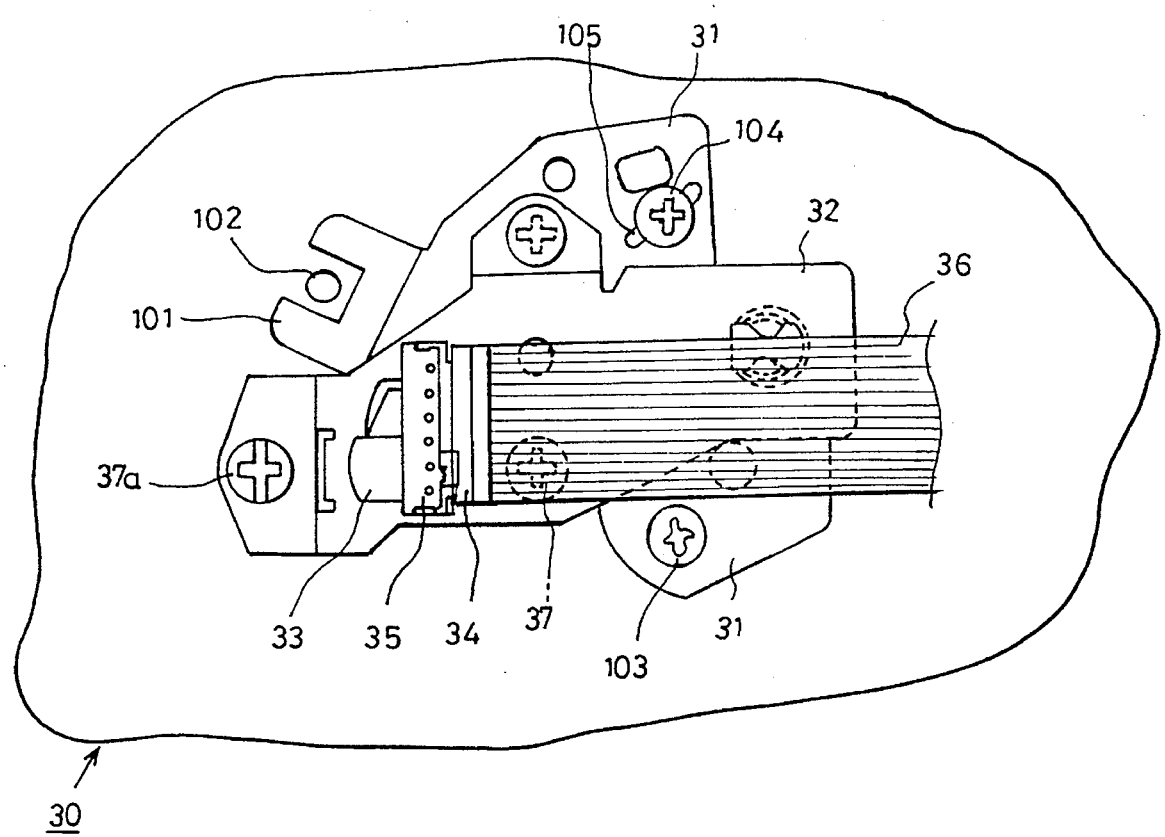
FIG. 3 is a top view showing still another conventional cable connecting apparatus of a VCR.
Figure 4A:
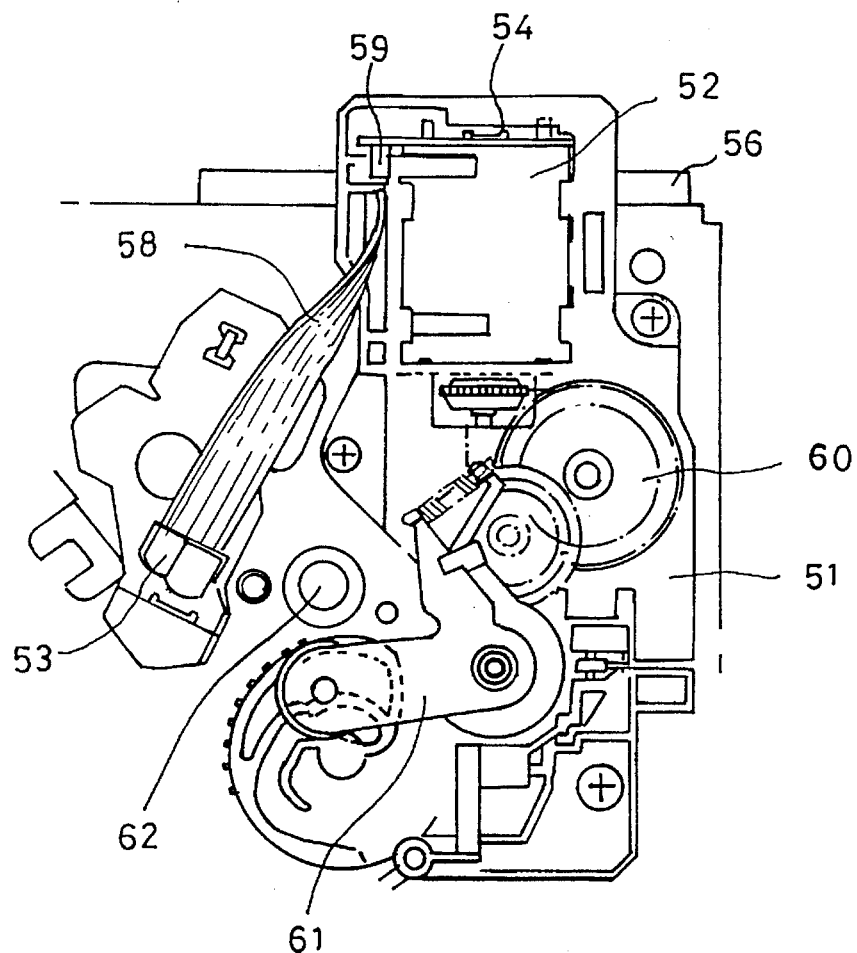
FIG. 4A is a top view showing a construction of a cable connecting apparatus for a VCR according to a first embodiment of the present invention.
Figure 4B:
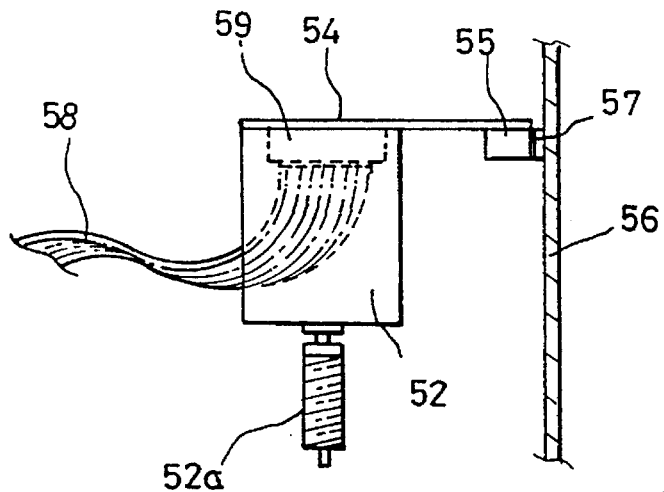
FIG. 4B is a side view showing a construction of a cable connecting apparatus for a VCR according to the first embodiment of the present invention.
Figure 4C:
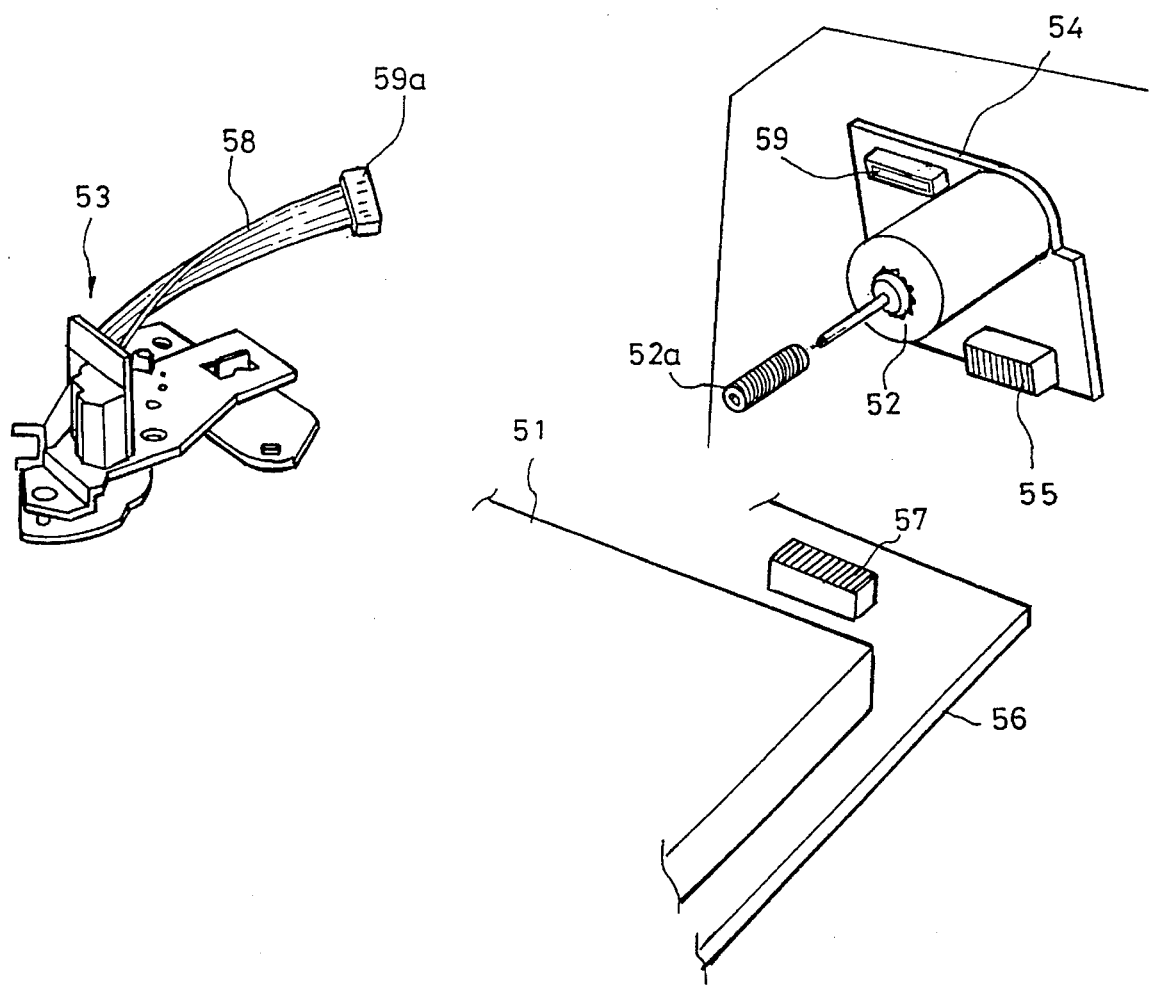
FIG. 4C is an exploded view showing a connection state among an A/C head, a loading motor, and a main PCB according to the first embodiment of the present invention.

Referring to FIGS. 4A through 4C, a cable connecting apparatus for a VCR according to a first embodiment of the present invention is provided with a loading motor 52 and an A/C head 53 each mounted on the upper surface of a base plate 51. A PCB 54 is attached to one side wall of the loading motor 52.

In addition, one end a cable 58 of which is connected to the A/C head 53 while the other end 59a of the cable 58 is connected to a connector 59 attached to the PCB 54. A connector 55 is attached to the PCB 54 and is connected to a connector 57 attached to the main PCB 56.

Reference numeral 52a denotes a speed reducing member, 60 denotes a gear arrangement, 62 denotes a capstan motor shaft, and all of them are driven by therein loading motor 52 so as to drive a tape.

In the first embodiment, since a connector 55 for connecting a main PCB 56 to the PCB 54 of the loading motor 52 and a connector 59 for connecting a cable 58 of the A/C head 53 are attached to each other, after engaging the loading motor 52 to the deck and after connecting the cable 58 of the A/C head 53 to the connector 59 of the loading motor 52, the deck is positioned on the main PCB 56 and then the cable connection procedure is completed.

Therefore, since the first embodiment of the present invention is directed to connect between the PCB of the loading motor and the main PCB in a board-to-board manner, the productivity of the VCR is enhanced. In addition, in case of checking the deck which is not assembled in the main PCB, it is not required to connect the cables of the A/C head and the loading motor each to the PCB, so that the productivity is enhanced.

Figure 5:
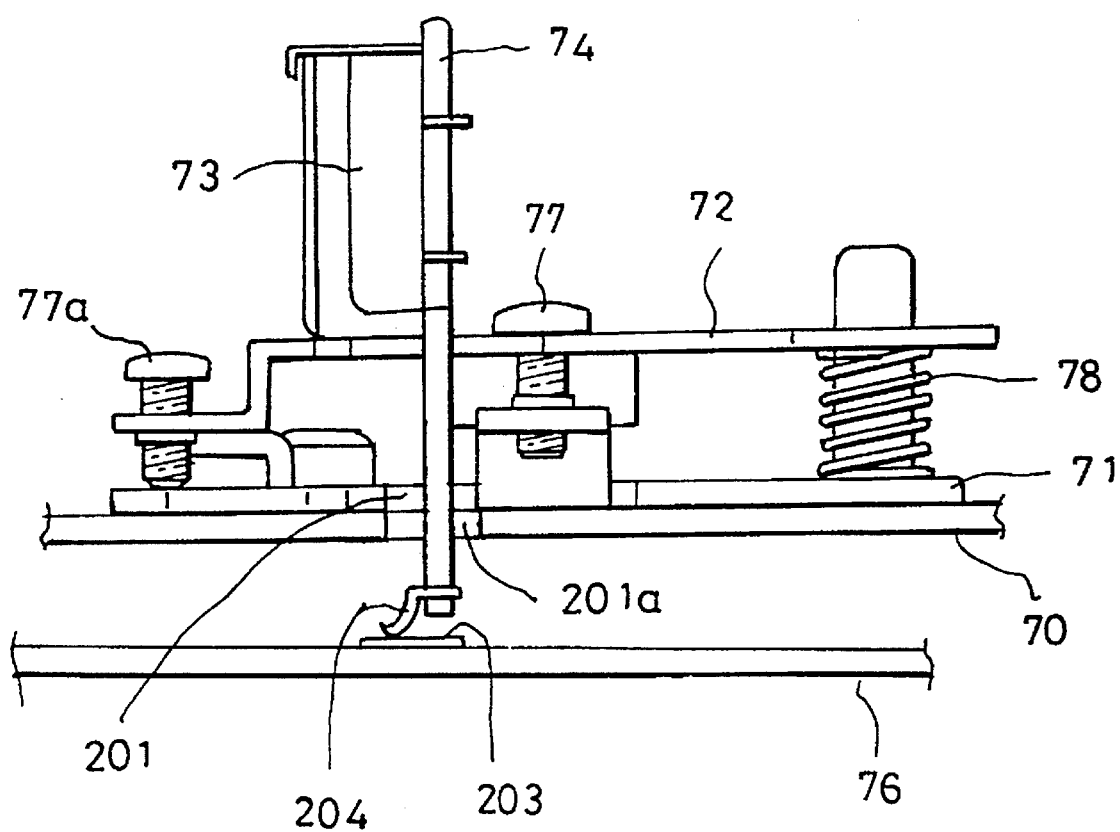
FIG. 5 is a top view showing a connection state between an A/C head and a main PCB according to a second embodiment of the present invention.

Meanwhile, referring to FIG. 5, there is shown a cable connecting apparatus for a VCR according to a second embodiment of the present invention.

Since the second embodiment has almost the same construction as the first embodiment, the elements similar to the first embodiment are given the same reference numerals, and the descriptions thereof will be omitted.

One end of the PCB 74 attached to the reverse wall of the A/C head 73 is downwardly extended through the support plate 71 and the base plate 70, and a brush 204, a signal transferring member, having an angled lower end made of a predetermined material having a predetermined elastic force is disposed at the lower end of the PCB 74.

At this time, the extended portion of the PCB 74 passes through the holes 201 and 201a formed on the support plate 71 and the base plate 70 and comes into contact with a copper surface 203 laterally disposed on the upper surface of the main PCB 76, so that the signals detected by the A/C head 73 are transmitted to the main PCB 76.

As described above, the second embodiment of the present invention is directed to adjust the gap within the previously set limit for the electric contact between the tape and the A/C head 73 using head base height adjusting screws 77 and 77a, so that the end portion of the brash 204 having a predetermined elastic force always comes into contact with the upper surface of the main PCB 76.

In addition, the second embodiment of the present invention is directed to adjust the distance between the head drum provided for detecting a video signal and the A/C head provided for detecting a control signal by moving the position of the support plate 71 using the adjusting hole, the first screw and the second screw, so that since the brush 204 slides onto the copper surface 203 formed on the upper surface of the main PCB, the brush 204 always comes into contact with the copper surface 203.

Therefore, the cable connecting apparatus between the A/C head and the main PCB according to the second embodiment of the present invention is directed to extend the one end of the PCB 74 attached to the reverse wall of the A/C head 73 toward the lower position than that of the support plate 71 and the base plate 70, so that the signals detected by the A/C head are transferred through the brash 204 engaged to the lower portion of the PCB 74 and thus it is convenient to correct the cables and is less costly to manufacture the VCR due to the reduced number of elements. In addition, the cable connecting apparatus according to the first and second embodiments of the present invention makes it easy to connect the loading motor, the A/C head, and the main PCB by providing the improved cable connecting apparatus, so that the productivity is enhanced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A cable connecting apparatus for a video cassette tape recorder, comprising:

a first printed circuit board;

a base plate disposed above said first printed circuit board;

a second printed circuit board attached to a loading motor mounted on said base plate;

an audio/control head mounted on the base plate for producing a predetermined output signal;

signal transmitting means for transmitting said predetermined output signal and connected between said audio/control head and said second printed circuit board; and signal connecting means mounted on the second printed circuit board for transmitting signals of the audio/control head and said loading motor to said first printed circuit board.

2. A cable connecting apparatus for a video cassette tape recorder, comprising:

a base plate having a hole formed in a predetermined portion thereof;

a first printed circuit board disposed below said base plate and having an elongated copper surface provided thereon; and an audio/control head mounted on the base plate and attached to a second printed circuit board having a signal transmitting means attached to the lower end thereof, wherein said signal transmitting means is downwardly extended toward the first printed circuit board through said hole in the base plate, whereby the signal transmitting means comes into contact with said copper surface.

3. The apparatus of claim 2, wherein said signal transmitting means has a rounded portion in contact with said copper surface.

4. The apparatus of claim 3, wherein said signal transmitting means is made of an elastic material having a predetermined elastic force.

5. The apparatus of claim 1, wherein the signal connecting means includes a first connector fixed to said second printed circuit board for directly connecting with a second connector fixed to said first printed circuit board.

6. An audio/control head signal connecting apparatus in a video cassette tape player including a main printed circuit board disposed below a base plate, a loading motor mounted on said base plate, and an audio/control head mounted on said base plate, for connecting signals between said audio/control head and said main printed circuit board, the apparatus comprising:

a loading motor printed circuit board attached to said loading motor;

connector means disposed on said main printed circuit board and on said loading motor printed circuit board for electrical connection of signals therebetween; and a signal transferring means connected between said audio/control head and said loading motor printed circuit board for transmitting audio/control head signals therebetween and to/from said main printed circuit board via said connector means.

7. An audio/control head signal connecting apparatus in a video cassette tape player including a main printed circuit board disposed below a base plate, a loading motor mounted on said base plate, and an audio/control head mounted on said base plate, for connecting signals between said audio/control head and said main printed circuit board, the apparatus comprising:

a loading motor printed circuit board attached to a loading motor;

connector means disposed on said main printed circuit board and on said loading motor printed circuit board for electrical connection of signals therebetween;

and wherein, said main printed circuit board has a first contact element disposed thereon;

said audio/control head is mounted on an audio/control head printed circuit board which extends downwards towards said main printed circuit board through an opening formed in said base plate, and which audio/control head printed circuit board has a second contact element at an end portion thereof which contacts said first contact element of said main printed circuit board for transmitting audio/control head signals therebetween.

8. The apparatus of claim 7, wherein said first and second contact elements are maintained in contact with each other for forming an electrical connection therebetween even when said audio/control head is moved for position adjustment.

\* \* \* \* \*